United States Patent [19]
Shiu et al.

[11] Patent Number: 5,956,569
[45] Date of Patent: Sep. 21, 1999

[54] INTEGRATED THERMOELECTRIC COOLER FORMED ON THE BACKSIDE OF A SUBSTRATE

[75] Inventors: Shou-Yi Shiu, Hsin-Chu; Yu-Ping Fang, Miaoli; Hon-Hung Lui, Hsin-Chu, all of Taiwan

[73] Assignee: Taiwan Semiconductor Manufacturing Company Ltd., Hsih-Chu, Taiwan

[21] Appl. No.: 08/957,677

[22] Filed: Oct. 24, 1997

[51] Int. Cl.$^6$ ..................................................... H01L 21/00
[52] U.S. Cl. .................. 438/48; 438/54; 438/55; 438/612; 438/928; 136/200; 136/201; 136/203; 136/204; 136/225; 136/228; 136/293; 361/718
[58] Field of Search .................................. 438/48, 54, 55, 438/612, 928; 361/718; 136/203, 204, 201, 293, 225, 228, 200

[56] References Cited

U.S. PATENT DOCUMENTS

| | | |
|---|---|---|
| 4,211,888 | 7/1980 | Stein et al. ............................... 136/225 |
| 5,393,351 | 2/1995 | Kinard et al. ............................ 136/225 |
| 5,837,929 | 11/1998 | Adelman ................................. 136/225 |

*Primary Examiner*—Richard Booth
*Assistant Examiner*—David A. Zarneke
*Attorney, Agent, or Firm*—George O. Saile; Stephen B. Ackerman; William J. Stoffel

[57] ABSTRACT

The present invention provides a structure and a method of fabricating a thermoelectric Cooler directly on the backside of a semiconductor substrate. The thermoelectric (TE) cooler (thermoelectric cooler) disperses heat from an integrated circuit (IC) that is formed on the front-side of the silicon substrate. Spaced first bonding pad holes 28 are formed in the backside of a substrate that expose bonding pads 24. Second holes 32 are formed between the spaced first bonding pad holes 28. A first insulating layer 34 is formed over the backside of the substrate, but not over the bonding pad 24. A metal layer is formed lining the first bonding pad holes 28. A polysilicon layer 46 is formed over the surface of the backside of the substrate in the second holes. The polysilicon layer is implanted thereby forming alternating adjacent N and P doped sections 46p 46n in the second holes. The adjacent N and P doped polysilicon sections 46n 46p are electrically connected to the bonding pads 24 by the metal layer 38.

21 Claims, 6 Drawing Sheets

INTEGRATED THERMOELECTRIC COOLER FORMED ON THE BACKSIDE OF A SUBSTRATE

BACKGROUND OF INVENTION

1) Field of the Invention

This invention relates generally to a structure and a method of fabrication of a cooling device for a semiconductor device and more particularly to a Peltier Thermoelectric cooler that is formed on the backside of a semiconductor wafer.

2) Description of the Prior Art

The present invention relates to thermoelectric coolers (TEC's). It is known to use a thermoelectric cooler to lower the-operating-temperature of a semiconductor device such as a laser. A thermoelectric cooler includes a plurality of thermoelectric cooling elements, which are constructed of materials with dissimilar characteristics. The elements are connected electrically in series and thermally in parallel to provide a plurality of thermoelectric couples. Each thermoelectric couple includes one element having a first characteristic and another element having a second characteristic. The thermoelectric couples are connected between two plates which function as a hot side and a cold side of a thermoelectric cooler. The hot side is thermally connected to a heat sink and the cold side is thermally connected to the semiconductor device.

Thermoelectric cooling is achieved by passing a DC electric current through the thermoelectric cooler. Thermal energy is drawn from the cold side to the hot side at a rate which is proportional to current passing through the circuit and the number of couples. At the hot side, the thermal energy is dissipated by the heat sink. The thermoelectric cooling effect is greatly increased when the dissimilar conducting materials used are semiconducting materials.

The dissimilar semiconducting materials generally used for thermoelectric cooling are N-type material (more electrons than necessary to complete a Perfect molecular lattice structure) and P-type material (fewer electrons than necessary to complete a perfect molecular lattice structure, thus providing holes). The extra electrons in the N-type material and the holes in the P-type material are called "carriers" which function to above the thermal energy from the cold side to the hot side.

Conventionally, TE coolers have been formed separately from the integrated circuit device. However, there is a need to develop an TE device that has increased cooling capability and is smaller.

The importance developing TE coolers for semiconductor devices is evidenced by the extensive technological development directed to the subject, as documented by the relevant patent and technical literature. The closest and apparently more relevant technical developments in the patent literature can be gleaned by considering U.S. Pat. No. 4,238,759 (Hunsperger) which shows a Peltier device that cools an adjacent P-N junction. The TE cooler is to be mounted on the front side (e.g., device side) the chip. U.S. Pat. No. 4,279,292 (Swiatosz) shows a TE cooler in contact with a central area of integrated circuit. U.S. Pat. No. 5,012,325 (Mansuria et al.) shows a TE IC package. U.S. Pat. No. 5,362,983 (Yamamura et al.) shows a TE module with a series connection. U.S. Pat. No. 5,419,780 (Suski) shows a Thermoelectric cooler contacting an IC and connected to a fan for additional cooling. U.S. Pat. No. 5,285,108 (Hasteing et al.) shows a Thermoelectric (TE) cooler contacting an integrated circuit (IC).

SUMMARY OF THE INVENTION

It is an object of the present invention to provide a structure of an integrated thermoelectric cooler (TE) (or Peltier device) on the backside of a substrate to directly disperse heat from an integrated circuit located on the front side of the substrate.

It is an object of the present invention to provide a method for fabricating an integrated thermoelectric cooler (TE) on the backside of a substrate to directly disperse heat from an integrated circuit located on the front side of the substrate.

It is an object of the present invention to provide a structure and method for fabricating an integrated thermoelectric cooler (TE) and a heat sink on the backside of a substrate to directly disperse heat from an integrated circuit located on the front side of the substrate.

To accomplish the above objectives, the present invention provides a method of fabricating an integrated thermoelectric Cooler formed on the backside of a substrate. The thermoelectric (TE) cooler 100 disperses heat from an integrated circuit (IC) 20 on the front-side 1OA of the Silicon wafer 10. See FIG. 13A. Spaced first bonding pad holes 28 are formed in the backside of a substrate 10 that expose bonding pads 24 located on the front side 10a of the substrate 10. Second holes 32 are formed between the spaced first bonding pad holes 28. A metal layer is formed lining the first bonding pad holes 28. A polysilicon layer 46 is formed over the surface of the backside of the substrate in the second holes. The polysilicon layer is implanted thereby forming alternating adjacent N and P doped sections 46p 46n in the second holes. The adjacent N and P doped polysilicon sections 46p 46n are electrically connected to the bonding pads 24 by the metal layer 38.

Figure 13A:
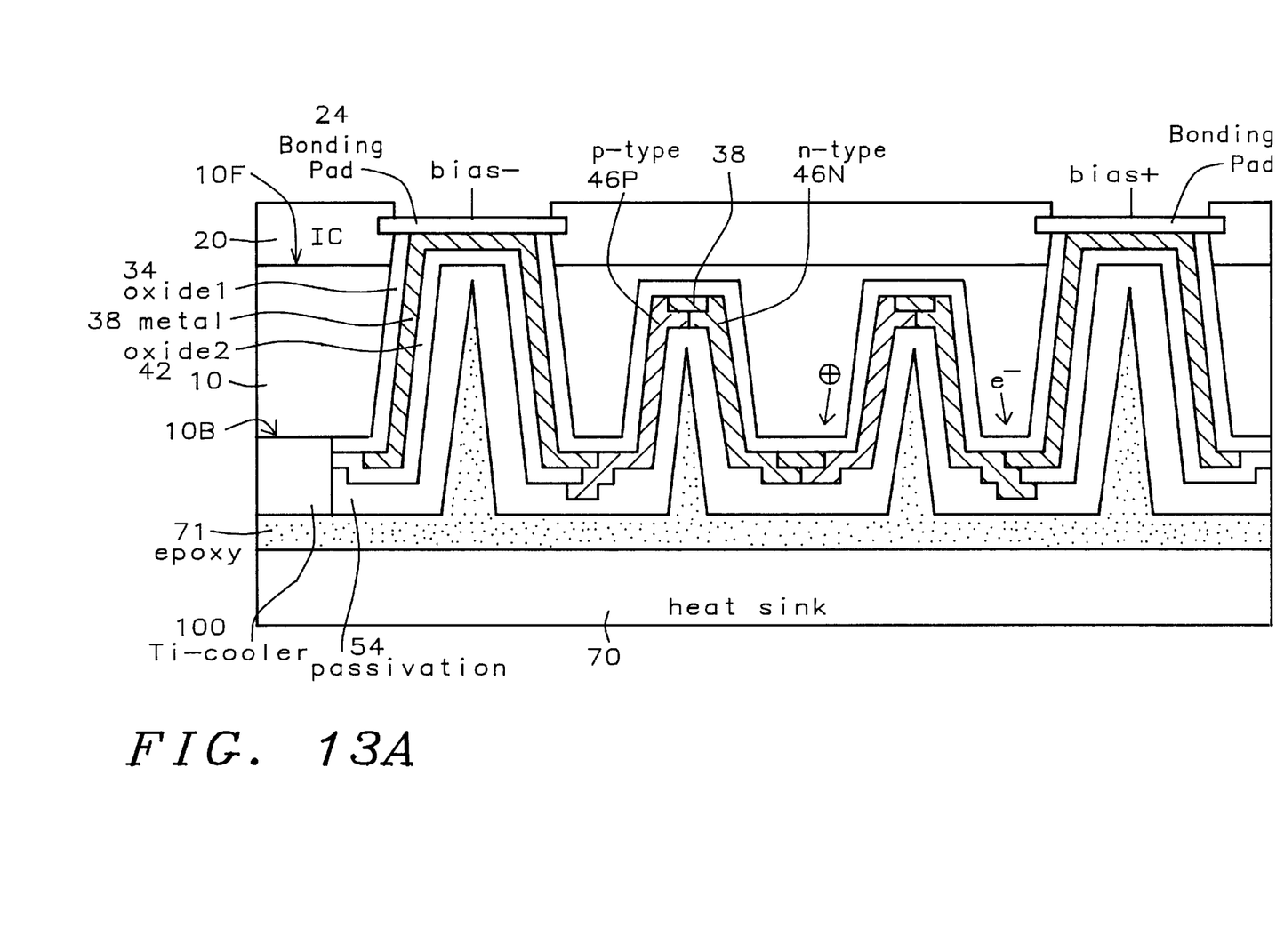
FIG. 13A is a cross sectional view illustrating the structure of the completed integrated thermoelectric cooler (TE) on the backside of a substrate according to the present invention.

The TE cooler cools the IC as follows. When we apply a bias to the bonding pad 24, the electric field forces electrons, the majority carrier of high concentration doped N-type poly silicon 50, to flow toward the backside of Si wafer. As the electron flow toward the backside of the substrate 10, the electrons also carry heat from IC 20 on the front-side. Also, because electric holes flow in opposite direction to election in electric field, in high concentration doped P-type poly Si 48, the majority carrier electric holes also flow toward the backside. This cools the IC 20 on the front side 10A of the substrate 10.

Figure 1A:
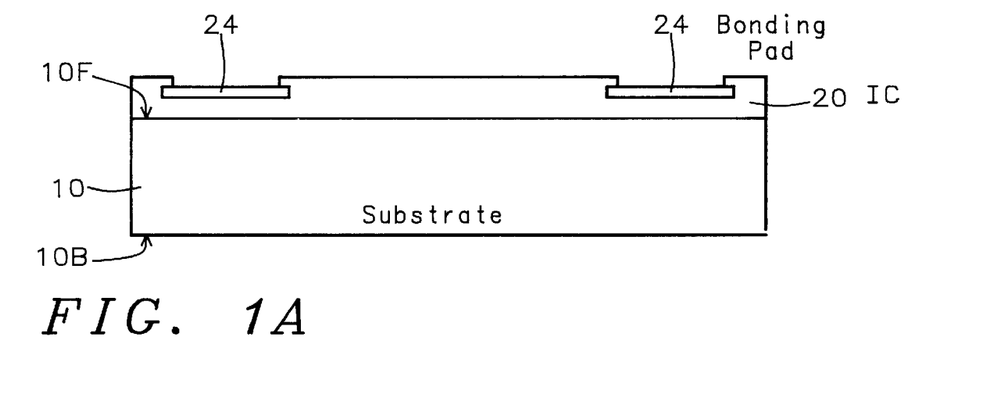
Figure 3A:
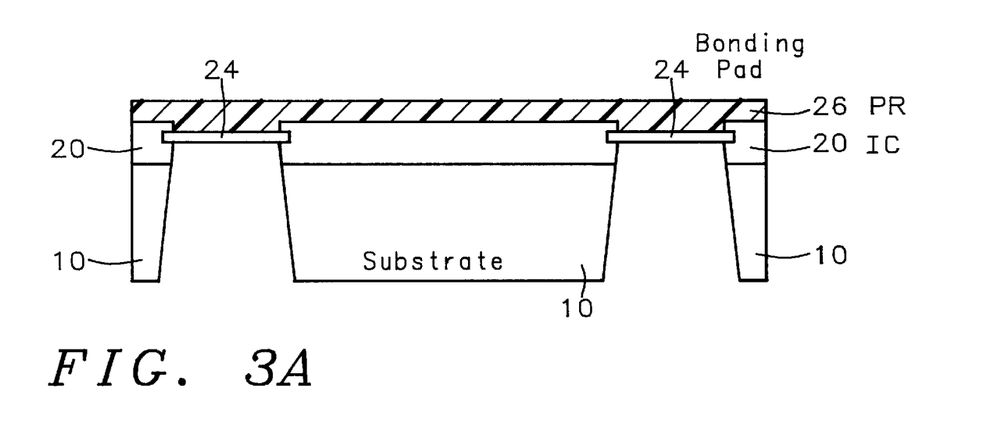
Figure 5A:
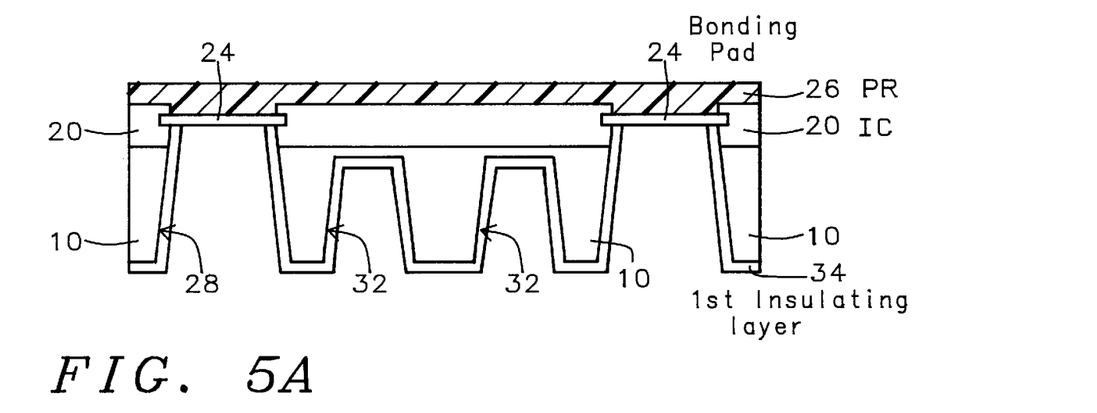
Figure 7A:
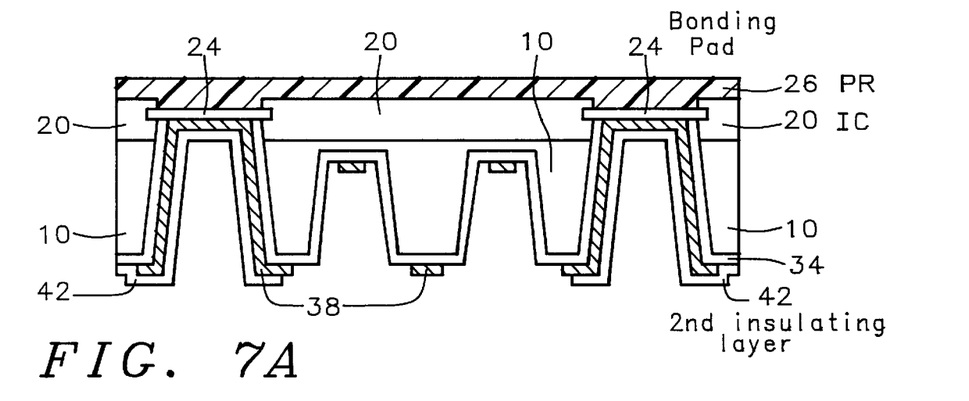
Figure 8A:
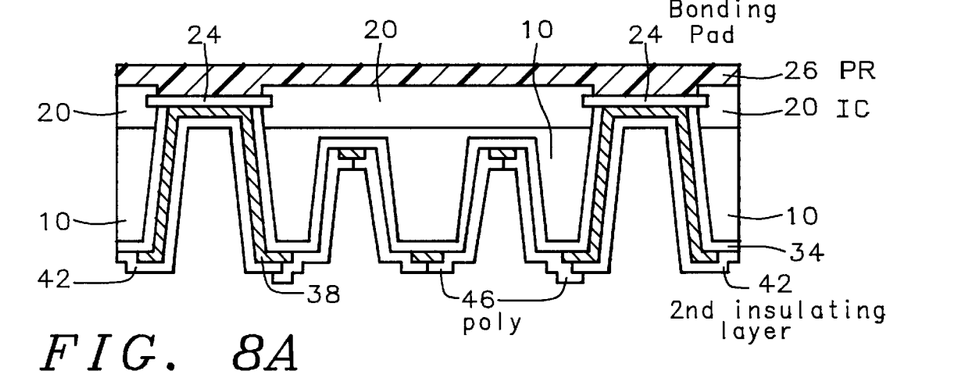

In slightly more detail, the method of the invention comprises:

a) See FIG. 1A—providing a substrate having a front side 10F and a backside 10B; providing an integrated circuit structure 20 having a top side and a bottom side; the bottom side of integrated circuit structure is on the top side of the substrate; the top side of the integrated circuit structure 20 having at least two spaced bonding pads 24;

b) forming a passivation photoresist layer 26 covering the top side of the integrated circuit structure 20 and the bonding pads 24;

c) FIG. 3A forming spaced first bonding pad holes 28 in the backside of the substrate and the integrated circuit structure exposing portions of the bonding pads 24c and exposing portions of the integrated circuit structure 20;

d) forming second holes 32 between the spaced first bonding pad holes 28 in the backside of the substrate;

e) See FIG. 5A—forming a first insulating layer 34 over the backside of the substrate and the exposed portions of the integrated circuit structure;

f) forming a first metal layer 38 over at least the first insulating layer lining at least the first bonding pad holes, in portions of the second holes, and between the second holes 28;

g) FIG. 7A—forming a second insulating layer 42 over the first metal layer 38 in the first bonding pad holes 28;

h) FIG. 8A—forming a first polysilicon layer 46 over the first insulating layer 34 and the first metal layer 38 at least in the second holes 28; the first metal layer 38 and the first polysilicon layer 46 connected to form an electrically conductive path between two adjacent bonding pads 24;

i) implanting the polysilicon layer 46p thereby forming alternating adjacent N doped polysilicon sections 46N and P doped polysilicon sections 46P 46p 46n in the second holes; the adjacent N doped polysilicon sections and P doped polysilicon sections 46p 46n are electrically connected to the bonding pads 24 by the metal layer 38; whereby the bonding pad, the metal layer, the alternating adjacent N doped polysilicon sections and P doped polysilicon sections 46p 46n function as an integrated thermoelectric cooler 100 by applying a bias to the bonding pads thereby withdrawing heat from the integrated circuit structure 20.

The present invention provides a structure and a method of fabricating a thermoelectric cooler directly on the backside of a semiconductor substrate. The thermoelectric (TE) cooler (thermoelectric cooler) disperses heat from an integrated circuit (IC) on the front-side of the Silicon wafer. The integrated TE cooler does not take up space on the front side of the substrate. In addition, the integrated TE cooler provides increased cooling because it is incorporated directly into the substrate. The fabricating method of the invention can be used to mass-produce the TE cooler. A major advantage of the invention is the integration of the TE cooler process with the semiconductor process.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A through 12A are cross sectional views for illustrating a method for manufacturing an integrated thermoelectric cooler (TE) (or Peltier device) on the backside of a substrate according to the present invention.

DETAILED DESCRIPTION OF THE PREFERRED EMBODIMENTS

The present invention will be described in detail with reference to the accompanying drawings. The present invention provides a method of forming an integrated TE Cooler formed on the backside of a substrate.

Figure 14A:
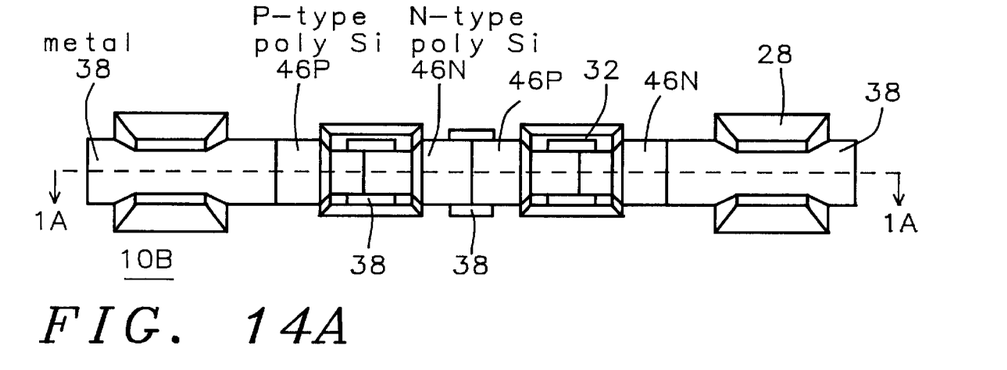
FIG. 14A is top down view of illustrating the structure of the completed integrated thermoelectric cooler (TE) on the backside of a substrate according to the present invention.
Figure 15A:
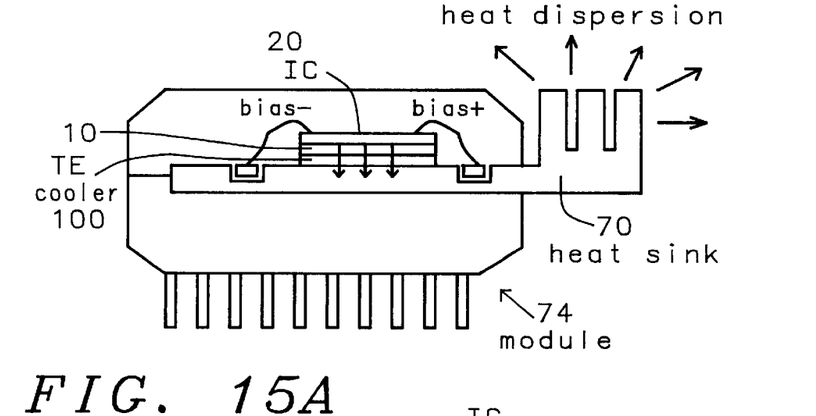
FIG. 15A is a cross sectional view illustrating the structure of the completed integrated thermoelectric cooler (TE) with a heat sink on the backside of a substrate according to the present invention.
Figure 16A:
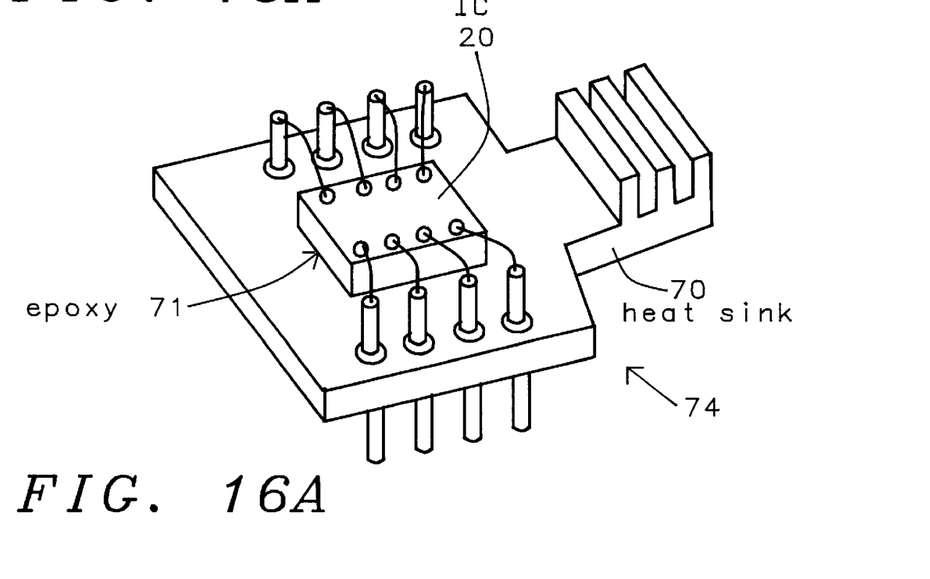
FIG. 16A is a three dimensional view of the completed integrated thermoelectric cooler (TE) with a heat sink on the backside of a substrate shown in FIG. 15A according to the present invention.

FIG. 13A shows a cross sectional view of the integrated TE cooler 100 of the invention on the backside of a substrate 10. FIG. 14A is a top down view (facing the backside of the substrate 10) of the integrated TE-Cooler of the present invention. FIG. 15A is cross sectional view of the integrated TE-Cooler 100 with a heat sink 70. The method of fabrication the TE-cooler is shown in FIGS. 1A to 12A which is viewed along the axis 1A in FIG. 14A.

In this invention, we use a semiconductor process to form a thermoelectric (TE) cooler (thermoelectric cooler) on the back-side of a Si wafer to disperse heat from an integrated circuit (IC) on the front-side of the Silicon wafer. The structure is shown in FIG. 13A (cross section). When we apply a bias to the bonding pad 24, the electric field forces electrons, the majority carrier of high concentration doped N-type poly silicon 50, to flow toward the back-side of Si wafer as shown in FIG. 13A. As the electron flow toward the backside of the substrate 10, they also carry heat from Integrated circuit (IC) 20 on the front-side. Also, because electric holes flow in opposite direction to election in electric field, in high concentration doped P-type poly Si 48, the majority carrier electric holes also flow toward the back-side. The integrated TE-cooler 100 is formed on the backside of Si wafer 100. This IC with integrated TE-cooler can be packaged as shown in FIG. 15A will disperse heat from IC to the heat sink 70 rapidly. In addition, a thermistor can be included in the IC 20 on the surface of the substrate and used to control the TE cooler to keep the IC at a constant temperature.

As shown in FIG. 1A, a substrate is provided having a front side 10A and a backside 10B. Also provided is an integrated circuit structure 20 having a bonding pad 24 on the front side 10F. The integrated circuit 20 has a top side and a bottom side. The bonding pad having a top side and a bottom side.

Integrated circuit structure 20 is understood to possibly include active and passive devices formed within the substrate and layers formed on the wafer surface. The integrated circuit structure can comprise source/drain region, gate electrodes, conductive and insulating layers, FET devices, and other semiconductor devices, etc. The term "semiconductor structure" is mean to include devices formed within a semiconductor wafer and the layers overlying the wafer.

The substrate 10 preferably has a thickness in a range of between about 300 and 450 μm.

Figure 2A:
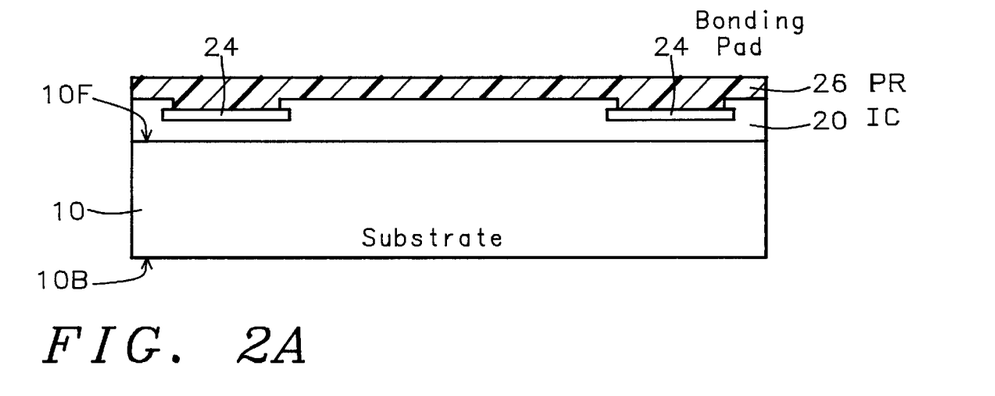

As shown in FIG. 2A, a passivation photoresist layer 26 is formed covering the top side of the integrated circuit (IC) structure 20. The passivation photoresist layer 26 serves to protect the IC structure 20 during the processing.

The passivation photoresist preferably has a thickness in a range of between about 2.5 and 5.0 μm.

As shown in FIG. 3A, spaced first bonding pad holes 28 are preferably formed in the backside of the substrate exposing portions of the bottom side of the bonding pad 24.

The first bonding pad holes 28 having an open dimension (width or length) in a range of between about 100 and 150 μm. The first bonding pad holes 28 are preferably formed by a dry etch process.

Figure 4A:
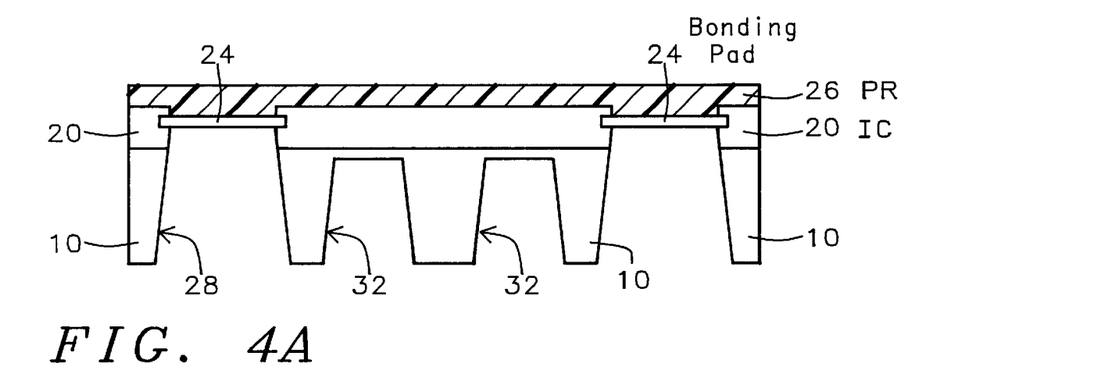

As shown in FIG. 4A, second holes 32 are etched partially through the substrate. The second holes preferably have a depth in a range of between about 250 and 400 μm; and preferably have an open dimension (width, length or diameter) in a range of between about 100 and 150 μm.

The second holes also enhance the cooling of the integrated circuit (IC) 20. The closer the bottom of the second holes are to the IC, the better the cooling of the IC 20. The second holes 32 increase the surface area of the doped polysilicon 46n 46p and enhance the cooling. Furthermore, the more holes 32 the better the cooling capacity. Only two holes 32 are shown in the figures between the first holes, but any number of second holes can be formed.

As shown in FIG. 5A, a first insulating layer 34 is formed over the backside 10B of the substrate 10. The first insulating layer is preferably composed of silicon oxide. The first insulating layer preferably has a thickness in a range of between about 3000 and 6000 Å. The first insulating layer is formed so that it covers the first and second holes 28 32 in the back side of the substrate and exposed portions of the integrated circuit structure 20. The first insulating layer does not cover the bonding pad 24 as shown in FIG. 5A. The first insulating layer is preferably patterned to expose the bonding pads 24 using a photolithographic process.

Figure 6A:
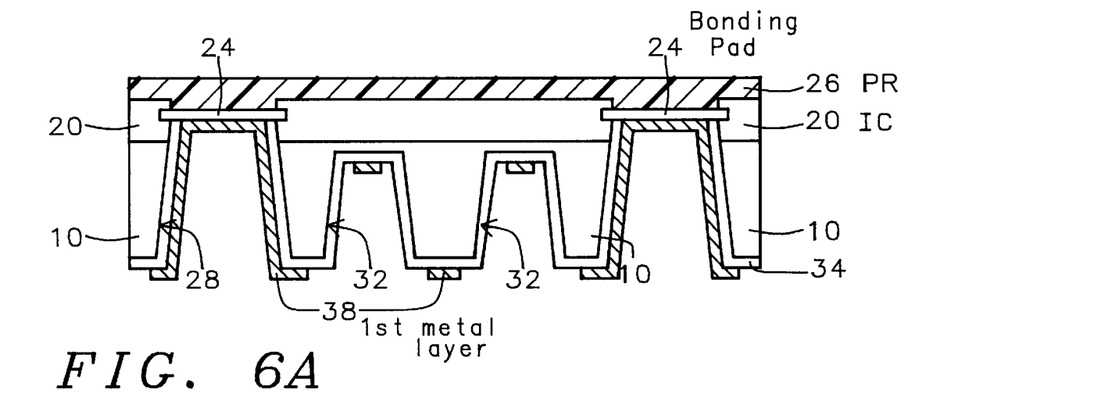

As shown in FIG. 6A, a first metal layer 38 is formed over the first insulating layer 34 at least in the first bonding pad holes 28 and in portions of the second holes 32 and over the substrate between the second holes. The first metal layer is preferably composed of an aluminum alloy or a Ti/TiN/AlSiCu sandwich structure and is more preferably composed of a Ti/TiN/AlSiCu sandwich structure and preferably has a thickness in a range of between about 5000 and 10,000 Å.

As shown in FIG. 7A a second insulating layer 42 is formed at least over the first metal layer 38 in the first bonding pad holes 28. The second insulating layer 42 is preferably composed of silicon oxide and preferably has a thickness in a range of between about 3000 and 6000 Å.

As shown in FIG. 8A, a first polysilicon layer 46 is formed over the first insulating layer 34 and the first metal layer 38 at least in the second holes 28. The first metal layer 38 and the first polysilicon layer 46 are connected to form an electrically conductive path between two adjacent bonding pads 24. The first polysilicon layer 46 has preferably thickness in a range of between about 3000 and 5000 Å.

Figure 9A:
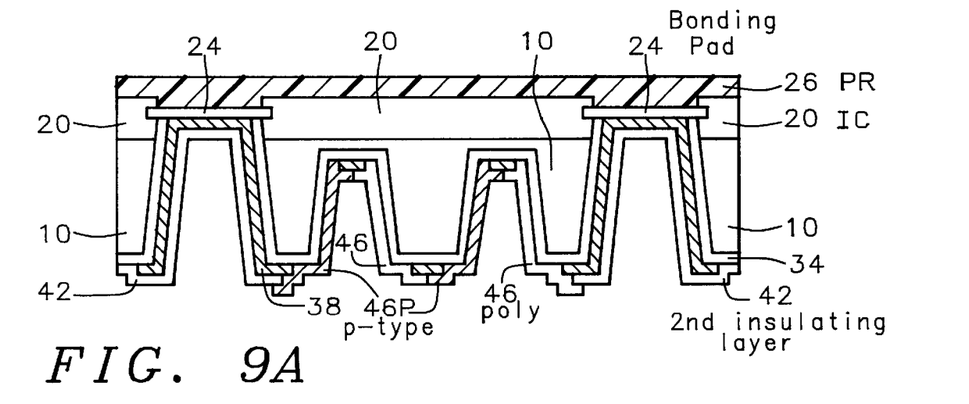

As shown in FIG. 9A, impurity ions of a first type (e.g., p-type) are implanted into portions of the first polysilicon layer 46 in the second holes 32 forming at least one first doped polysilicon region 46p. An ion implant (I/I) photoresist mask (not shown) is preferably used to define the areas where the ions are implanted.

The first doped polysilicon regions 46p preferably have an ion concentration of a first type of P type impurities with a concentration in a range of between about 1E19 and 1E21 atoms/cc.

Table: preferred p-type implantation parameters

|  | units | Low | tgt | hi |
| --- | --- | --- | --- | --- |
| Implant Energy | Kev | 35 | 40 | 45 |
| dose | atom/cm$^2$ | 3.5 E15 | 4E15 | 1E16 |
| ion type |  |  | BF$_2$ |  |
| concentration of p-regions 46P | atom/cm$^3$ | 5E20 | 1E21 | 5E21 |

Figure 10A:
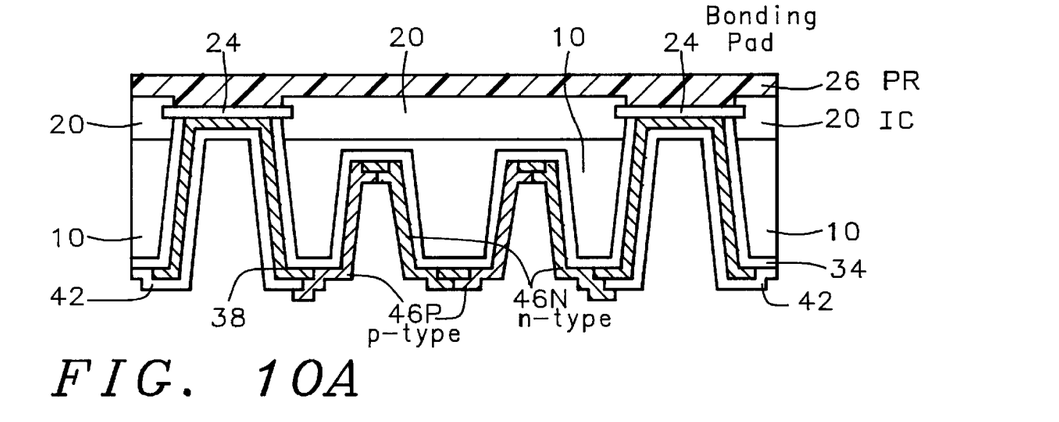

As shown in FIG. 10A, impurity ions of a second type (e.g., n-type) are implanted into the portions of the first polysilicon layer 46 in the second holes 32 forming at least one second doped polysilicon region 46n. The second doped polysilicon region(s) 46n are adjacent to the first doped polysilicon region 46p and adjacent to the first metal layer 38. An ion implant (I/I) photoresist mask (not shown) is preferably used to define the areas where the ions are implanted.

The second doped polysilicon regions 46n preferably have an ion concentration of a first type of N type impurities with a concentration in a range of between about 1E19 and 1E21 atoms/cc.

Table: preferred n-type implantation parameters

|  | units | Low | tgt | hi |
| --- | --- | --- | --- | --- |
| Implant Energy | Kev | 55 | 60 | 65 |
| dose | atom/cm$^2$ | 1E15 | 5E15 | 1E16 |
| ion type (e.g., As, |  |  | As |  |
| concentration of region 46N | atom/cm$^3$ | 1E19 | 1E20 | 1E21 |

The order of the N and P type implantation can obviously be reversed.

Figure 11A:
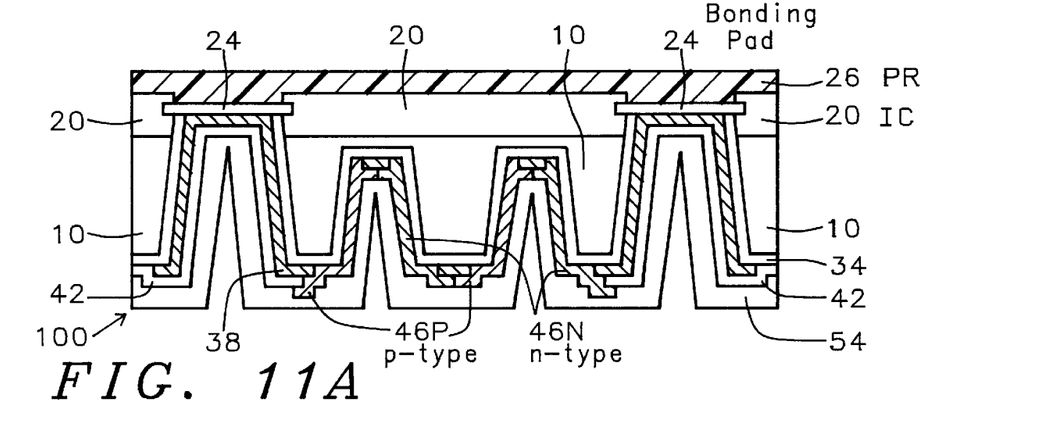

As shown in FIG. 11A, a passivation layer 54 is formed over the polysilicon layer 34 and the second insulating layer 42. The passivation layer 54 is preferably composed of SiO$_2$, Si$_3$N$_4$, or a SiO$_2$ / Si$_3$N$_4$ bi-layer and preferably has a thickness in a range of between about 10,000 and 15,000 Å. A thin passivation layer 54 to allows better cooling.

Figure 12A:
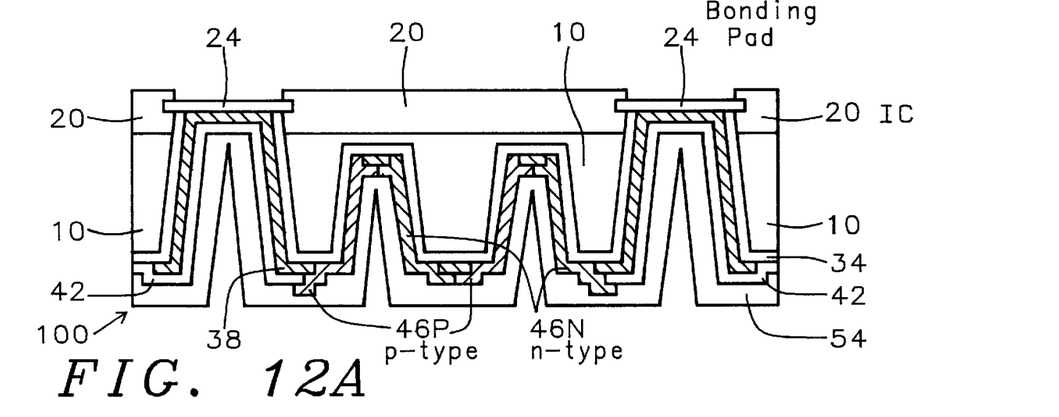

As shown in FIG. 12A, the passivation photoresist layer 26 is then removed from the top side of the integrated circuit structure 20.

The bonding pad, the metal layer, the first doped polysilicon regions and the second doped polysilicon region function as an integrated TC Pelitzer cooler 100. The TC cooler 100 is operated by applying a bias to the bonding pads thereby withdrawing heat from the integrated circuit structure 20.

FIG. 13A shows the attachment of the heat sink 70 using an epoxy 71 or other adhesive.

As shown in FIG. 14A, a heat sink 70 is preferably connected to, and contacts, the passivation layer 54 thereby conducting heat away from said substrate 10. The heat sink is preferably composed of a material that quickly conducts heat away from the TE cooler and into the surroundings.

FIG. 15 shows a three dimensional view of a preferred embodiment of the IC 20, epoxy 71, heat sink 70 and module 74.

The present invention provides a structure and method for fabricating an integrated thermoelectric cooler (TE) and a heat sink on the backside of a substrate to directly disperse heat from an integrated circuit located on the front side of the substrate.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an integrated thermoelectric cooler formed on the backside of a substrate, comprising:

a) providing a substrate having a front side and a backside; providing an integrated circuit structure having a top side and a bottom side; said bottom side of integrated circuit structure on said top side of said substrate; said top side of said integrated circuit structure having spaced bonding pads;

b) forming spaced first bonding pad holes in said backside of said substrate and said integrated circuit structure exposing portions of said bonding pads and exposing portions of said integrated circuit structure;

c) forming second holes between said spaced first bonding pad holes in said backside of said substrate;

d) forming a first insulating layer over said backside of said substrate and the exposed portions of said integrated circuit structure;

e) forming a first metal layer over at least said first insulating layer lining at least said first bonding pad holes, in portions of said second holes, and between said second holes;

f) forming a second insulating layer over said first metal layer in said first bonding pad holes;

g) forming a first polysilicon layer over said first insulating layer and said first metal layer at least in said second holes; said first metal layer and said first polysilicon layer connected to form an electrically conductive path between two adjacent bonding pads;

h) implanting said first polysilicon layer thereby forming alternating adjacent N doped polysilicon sections and P doped polysilicon sections in the second holes; said adjacent N doped polysilicon sections and P doped polysilicon sections are electrically connected to the bonding pads by said metal layer; whereby said bonding pad, said metal layer, said alternating adjacent N doped polysilicon sections and P doped polysilicon sections function as an integrated thermoelectric cooler by applying a bias to said bonding pads thereby withdrawing heat from said integrated circuit structure.

2. The method of claim 1 which further includes after step (a) forming a passivation photoresist layer covering said top side of said integrated circuit structure and said bonding pads.

3. The method of claim 1 wherein said first bonding pad holes having an open dimension in a range of between about 100 and 150 µm and said substrate has a thickness in a range of between about 300 and 450 µm.

4. The method of claim 1 wherein said second holes having a depth in a range of between about 250 and 400 µm; and having an open dimension in a range of between about 100 and 150 µm.

5. The method of claim 1 wherein said first insulating layer is composed of silicon oxide and said first insulating layer having a thickness in a range of between about 3000 and 6000 Å.

6. The method of claim 1 wherein said first metal layer is composed of a three layer Ti/TiN/AlSiCu structure; and having a thickness in a range of between about 5000 and 10,000 Å.

7. The method of claim 1 wherein said second insulating layer composed of silicon oxide and having a thickness in a range of between about 3000 and 6000 Å.

8. The method of claim 1 wherein said first polysilicon layer has thickness in a range of between about 3000 and 5000 Å.

9. The method of claim 1 wherein said first doped polysilicon regions having an ion concentration of a first type of P type impurities with a concentration in a range of between about 3000 and 5000 atoms/cc.

10. The method of claim 1 wherein said second doped polysilicon region having an ion concentration of a first type of N type impurities with a concentration in a range of between about 1E19 and 1E21 atoms/cc.

11. The method of claim 1 wherein said passivation layer composed of a $SiO_2$/Silicon nitride bi-layer and having a thickness in a range of between about 10,000 and 15,000 Å.

12. The method of claim 1 which further includes attaching a heat sink to said passivation layer thereby conducting heat away from said substrate.

13. The method of claim 1 which further includes providing a thermistor in said integrated circuit structure; controlling the temperature of said integrated circuit structure at a constant temperature with said integrated Thermoelectric cooler.

14. A method of fabrication of an integrated thermal electric cooler formed on the backside of a substrate, comprising:

a) providing a substrate having a front side and a backside; providing an integrated circuit structure having a top side and a bottom side; said bottom side of integrated circuit structure on said top side of said substrate; said top side of said integrated circuit structure having spaced bonding pads; said substrate has a thickness in a range of between about 300 and 450 µm;

b) forming a passivation photoresist layer covering said top side of said integrated circuit structure and said spaced bonding pads;

c) forming second holes between said spaced first bonding pad holes in said backside of said substrate exposing portions said bottom side of said bonding pad and exposing portions of said integrated circuit structure; said first bonding pad holes having an open dimension in a range of between about 100 and 150 µm;

d) etching second holes partially through said substrate; said second holes having a depth in a range of between about 250 and 400 µm; and having an open dimension in a range of between about 100 and 150 µm;

e) forming a first insulating layer over said backside of said substrate and the exposed portions of said integrated circuit structure;

f) forming a first metal layer over said first insulating layer in at least in said first bonding pad holes and in portions of said second holes and between said second holes;

g) forming a second insulating layer over at least said first metal layer in said first bonding pad holes;

h) forming a first polysilicon layer over at least said first insulating layer and said first metal layer at least in said second holes; said first metal layer and said first polysilicon layer connected to form an electrically conductive path between two adjacent bonding pads; said first polysilicon layer has thickness in a range of between about 3000 and 5000 Å;

i) implanting impurity ions of a first type into portions of said first polysilicon layer in said second holes forming at least one first doped polysilicon region; said first doped polysilicon regions having an ion concentration of a first type of P type impurities with a concentration in a range of between about 3000 and 5000 atoms/cc;

j) implanting impurity ions of a second type into portions of said first polysilicon layer in said second holes forming at least one second doped polysilicon region; said second doped polysilicon region adjacent to said first dope polysilicon region and adjacent to said first metal layer; said second doped polysilicon region having an ion concentration of a first type of N type impurities with a concentration in a range of between about 1E19 and 1E21 atoms/cc;

k) forming a passivation layer over said polysilicon layer and said second insulating layer;

l) removing said passivation photoresist layer from said top side of said integrated circuit structure; whereby said bonding pad, said metal layer, said first doped polysilicon regions and said second doped polysilicon region function as an integrated Thermoelectric cooler by applying a bias to said bonding pads thereby withdrawing heat from said integrated circuit structure.

15. The method of claim 14 wherein said first insulating layer composed of silicon oxide and said first insulating layer having a thickness in a range of between about 3000 and 6000 Å.

16. The method of claim 14 wherein said first metal layer composed of a three layer Ti/TiN/AlSiCu structure; and having a thickness in a range of between about 5000 and 10,000 Å.

17. The method of claim 14 wherein said second insulating layer composed of silicon oxide and having a thickness in a range of between about 3000 and 6000 Å.

18. The method of claim 14 wherein said passivation layer composed of a SiO$_2$/Silicon nitride bi-layer and having a thickness in a range of between about 10,000 and 15,000 Å.

19. The method of claim 14 which further includes attaching a heat sink to said passivation layer thereby conducting heat away from said substrate.

20. The method of claim 14 which further includes providing a thermistor in said integrated circuit structure; controlling the temperature of said integrated circuit structure at a constant temperature with said integrated Thermoelectric cooler.

21. A method of fabrication of an integrated thermal electric cooler formed on the backside of a substrate, comprising:

a) providing a substrate having a front side and a backside; providing an integrated circuit structure having a top side and a bottom side; said bottom side of integrated circuit structure on said top side of said substrate; said top side of said integrated circuit structure having spaced bonding pads; said substrate having a thickness in a range of between about 300 and 400 μm;

b) forming a passivation photoresist layer covering said top side of said integrated circuit structure and said spaced bonding pads;

c) forming second holes between said spaced first bonding pad holes in said backside of said substrate exposing portions said bottom side of said bonding pad and exposing portions of said integrated circuit structure; said first bonding pad holes having an open dimension in a range of between about 100 and 150 μm;

d) etching second holes partially through said substrate; said second holes having a depth in a range of between about 250 and 400 μm; and having an open dimension in a range of between about 100 and 150 μm;

e) forming a first insulating layer over said backside of said substrate and the exposed portions of said integrated circuit structure; said first insulating layer composed of silicon oxide and said first insulating layer having a thickness in a range of between about 3000 and 6000 Å;

f) forming a first metal layer over said first insulating layer in at least in said first bonding pad holes and in portions of said second holes and between said second holes; said first metal layer composed of a three layer Ti/TiN/AlSiCu structure; and having a thickness in a range of between about 5000 and 10,000 Å;

g) forming a second insulating layer over said first metal layer in said first bonding pad holes; said second insulating layer composed of silicon oxide and having a thickness in a range of between about 3000 and 6000 Å;

h) forming a first polysilicon layer over said first insulating layer and said first metal layer at least in said second holes; said first metal layer and said first polysilicon layer connected to form an electrically conductive path between two adjacent bonding pads; said first polysilicon layer has thickness in a range of between about 3000 and 5000 Å;

i) implanting impurity ions of a first type into portions of said first polysilicon layer in said second holes forming at least one first doped polysilicon region; said first doped polysilicon regions having an ion concentration of a first type of P type impurities with a concentration in a range of between about 3000 and 5000 atoms/cc;

j) implanting impurity ions of a second type into portions of said first polysilicon layer in said second holes forming at least one second doped polysilicon region; said second doped polysilicon region adjacent to said first dope polysilicon region and adjacent to said first metal layer; said second doped polysilicon region having an ion concentration of a first type of N type impurities with a concentration in a range of between about 1E19 and 1E21 atoms/cc;

k) forming a passivation layer over said polysilicon layer and said second insulating layer; said passivation layer composed of a SiO$_2$/Silicon nitride bi-layer and having a thickness in a range of between about 10,000 and 15,000 Å;

l) removing said passivation photoresist layer from said top side of said integrated circuit structure; whereby said bonding pad, said metal layer, said first doped polysilicon regions and said second doped polysilicon region function as an integrated Thermoelectric cooler by applying a bias to said bonding pads thereby withdrawing heat from said integrated circuit structure.

* * * * *